(12) United States Patent
Murata et al.

(10) Patent No.: US 9,373,531 B2
(45) Date of Patent: Jun. 21, 2016

(54) SUBSTRATE TRANSFER DEVICE, SUBSTRATE PROCESSING APPARATUS, AND SUBSTRATE ACCOMMODATION METHOD

(71) Applicant: Tokyo Electron Limited, Tokyo (JP)

(72) Inventors: Akira Murata, Koshi (JP); Katsuhiro Morikawa, Koshi (JP); Issei Ueda, Koshi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 360 days.

(21) Appl. No.: 14/183,651

(22) Filed: Feb. 19, 2014

(65) Prior Publication Data

US 2014/0234058 A1    Aug. 21, 2014

(30) Foreign Application Priority Data

Feb. 20, 2013    (JP) .................. 2013-031295

(51) Int. Cl.
*H01L 21/67*    (2006.01)

(52) U.S. Cl.
CPC ............................. *H01L 21/67265* (2013.01)

(58) Field of Classification Search
CPC .............................................. H01L 21/67265
See application file for complete search history.

(56) References Cited

U.S. PATENT DOCUMENTS

| | | | | | |
|---|---|---|---|---|---|
| 5,565,034 A | * | 10/1996 | Nanbu | ............... | H01L 21/67173 118/319 |
| 5,906,469 A | * | 5/1999 | Oka | ................... | H01L 21/67265 414/416.08 |
| 6,208,909 B1 | * | 3/2001 | Kato | ................. | H01L 21/67265 414/331.14 |
| 7,751,922 B2 | * | 7/2010 | Hirano | .............. | H01L 21/67109 438/14 |
| 8,892,242 B2 | * | 11/2014 | Kimura | ............. | H01L 21/67265 414/796.4 |
| 9,184,080 B2 | * | 11/2015 | Yoshida | ............ | H01L 21/67781 |
| 2007/0260341 A1 | * | 11/2007 | Wu | .................... | H01L 21/67265 700/95 |
| 2013/0238113 A1 | * | 9/2013 | Kawasaki | ......... | H01L 21/67265 700/121 |
| 2014/0178162 A1 | * | 6/2014 | Morikawa | ......... | H01L 21/67772 414/416.08 |

FOREIGN PATENT DOCUMENTS

| | | |
|---|---|---|
| JP | 04-311056 A | 11/1992 |
| JP | 11-145244 A | 5/1999 |
| JP | 2003-168715 A | 6/2003 |
| JP | 2007-150063 A | 6/2007 |
| JP | 2010-067706 A | 3/2010 |

* cited by examiner

*Primary Examiner* — James Keenan
(74) *Attorney, Agent, or Firm* — Pearne & Gordon LLP

(57) ABSTRACT

A substrate can be appropriately accommodated in a cassette. A substrate transfer device includes a substrate transfer unit that delivers the substrate with respect to the cassette configured to accommodate the substrate; a detection unit that detects the substrate accommodated in the cassette; and a control device than controls the substrate transfer unit. Further, the control device includes a transfer control unit configured to control the substrate transfer unit to accommodate the substrate at a predetermined target accommodation position; a determination unit configured to determine an actual accommodation position for the substrate based on a detection result of the detection unit after the detection unit detects the substrate accommodated in the cassette; and a correction unit configured to correct a predetermined target accommodation position as an accommodation position for another substrate based on a difference between the actual accommodation position and the target accommodation position for the substrate.

13 Claims, 8 Drawing Sheets

SUBSTRATE TRANSFER DEVICE, SUBSTRATE PROCESSING APPARATUS, AND SUBSTRATE ACCOMMODATION METHOD

CROSS-REFERENCE TO RELATED APPLICATION

This application claims the benefit of Japanese Patent Application No. 2013-031259 filed on Feb. 20, 2013, the entire disclosures of which are incorporated herein by reference.

TECHNICAL FIELD

The embodiments described herein pertain generally to a substrate transfer device, a substrate processing apparatus, and a substrate accommodation method.

BACKGROUND

Conventionally, there has been known a substrate processing apparatus that unloads substrates in sequence from a cassette accommodating multiple substrates, and then, performs a process thereon.

By way of example, Patent Document 1 describes a substrate processing apparatus configured to specify an accommodation position for each substrate accommodated in a cassette by using a detection unit such as a reflective sensor or the like, unload a substrate from the same cassette according to a specified accommodation position, and return the unloaded substrate to the same cassette.

Patent Document 1: Japanese Patent Laid-open Publication No. H11-145244

However, if the unloaded substrate is not returned to the original cassette but returned to a different cassette, it is difficult to find out an accommodation position in the different cassette by using the above-described technique. For this reason, in this case, the substrate is accommodated according to a target accommodation position previously stored.

However, by way of example, if the cassette is not appropriately mounted on a mounting table or is slightly inclined, an actual accommodation position deviates from the target accommodation position previously stored. Therefore, the substrate may not be appropriately accommodated in the cassette.

SUMMARY

In view of the foregoing problems, example embodiments provide a substrate transfer device, a substrate processing apparatus, and a substrate accommodation method capable of appropriately accommodating a substrate in a cassette.

In one example embodiment, a substrate transfer device includes a substrate transfer unit configured to deliver a substrate with respect to a cassette configured to accommodate the substrate; a detection unit configured to detect the substrate accommodated in the cassette; and a control device configured to control the substrate transfer unit. Further, the control device includes a transfer control unit configured to control the substrate transfer unit to accommodate the substrate at a predetermined target accommodation position; a determination unit configured to determine an actual accommodation position for the substrate based on a detection result of the detection unit after the detection unit detects the substrate accommodated in the cassette; and a correction unit configured to correct a predetermined target accommodation position as an accommodation position for another substrate based on a difference between the actual accommodation position and the target accommodation position for the substrate.

According to the example embodiments, a substrate can be appropriately accommodated in a cassette.

The foregoing summary is illustrative only and is not intended to be in any way limiting. In addition to the illustrative aspects, embodiments, and features described above, further aspects, embodiments, and features will become apparent by reference to the drawings and the following detailed description.

BRIEF DESCRIPTION OF THE DRAWINGS

In the detailed description that follows, embodiments are described as illustrations only since various changes and modifications will become apparent to those skilled in the art from the following detailed description. The use of the same reference numbers in different figures indicates similar or identical items.

DETAILED DESCRIPTION

Figure 1:
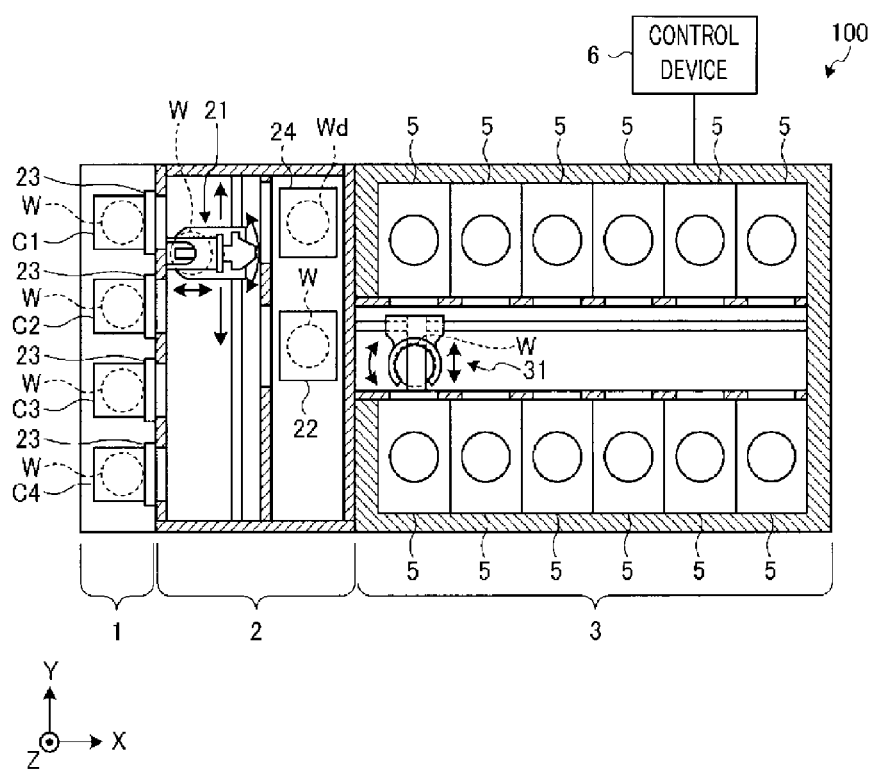
FIG. 1 illustrates a schematic configuration of a substrate processing apparatus in accordance with a first example embodiment.

In the following detailed description, reference is made to the accompanying drawings, which form a part of the description. In the drawings, similar symbols typically identify similar components, unless context dictates otherwise. Furthermore, unless otherwise noted, the description of each successive drawing may reference features from one or more of the previous drawings to provide clearer context and a more substantive explanation of the current example. Still, the examples described in the detailed description, drawings, and claims are not meant to be limiting. Other embodiments may be utilized, and other changes may be made, without departing from the spirit or scope of the subject matter presented herein. It will be readily understood that the aspects of the present disclosure, as generally described herein and illustrated in the drawings, may be arranged, substituted, combined, separated, and designed in a wide variety of different configurations, all of which are explicitly contemplated herein.

First Example Embodiment

A schematic configuration of a substrate processing apparatus in accordance with a first example embodiment will be explained with reference to FIG. 1. FIG. 1 illustrates a schematic configuration of a substrate processing apparatus in accordance with a first example embodiment.

Further, hereinafter, in order to clarify a positional relationship, an X-axis, a Y-axis, and a Z-axis orthogonal to one another will be defined, and a positive direction of the Z-axis will be defined as a vertical upward direction. Furthermore, hereinafter, a negative direction side of the X-axis will be defined as a front side of the substrate processing apparatus, and a positive direction side of the X-axis will be defined as a back side of the substrate processing apparatus.

As depicted in FIG. 1, a substrate processing apparatus 100 includes a loading/unloading station 1, a transfer station 2, and a processing station 3. The loading/unloading station 1, the transfer station 2, and the processing station 3 are arranged in this sequence from the front side to the back side of the substrate processing apparatus 100.

The loading/unloading station 1 is a region where multiple cassettes are mounted, and for example, 4 cassettes C1 to C4 are mounted while being arranged from side to side in close contact with a front wall of the transfer station 2. Each of the cassettes C1 to C4 is an accommodation vessel where multiple wafers W can be horizontally accommodated at multiple levels.

The transfer station 2 is positioned on a back side of the loading/unloading station 1, and includes therein a substrate transfer unit 21 and a substrate transit table 22. On the substrate transit table 22, a buffer cassette (not illustrated) configured to temporarily accommodate multiple wafers W is mounted.

The substrate transfer unit 21 is configured to transit the wafers W between the cassettes C1 to C4 mounted on the loading/unloading station 1 and the buffer cassette mounted on the substrate transit table 22. To be specific, the substrate transfer unit 21 unloads the wafers W from the cassettes C1 to C4, and then, accommodates them in the buffer cassette. Further, the substrate transfer unit 21 unloads the wafers W from the buffer cassette, and then, accommodates them in the cassettes C1 to C4.

Further, the transfer station 2 includes a substrate detection unit 23 for each of the cassettes C1 to C4, the substrate detection unit 23 is configured to detect the wafers W accommodated in the cassettes C1 to C4.

Figure 2A:
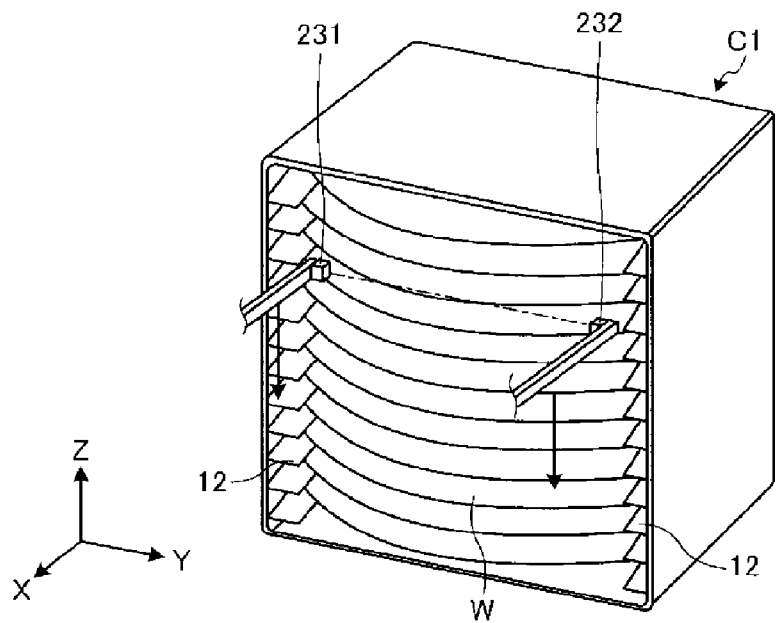
FIG. 2A illustrates a schematic configuration of a cassette and a substrate detection unit.
Figure 2B:
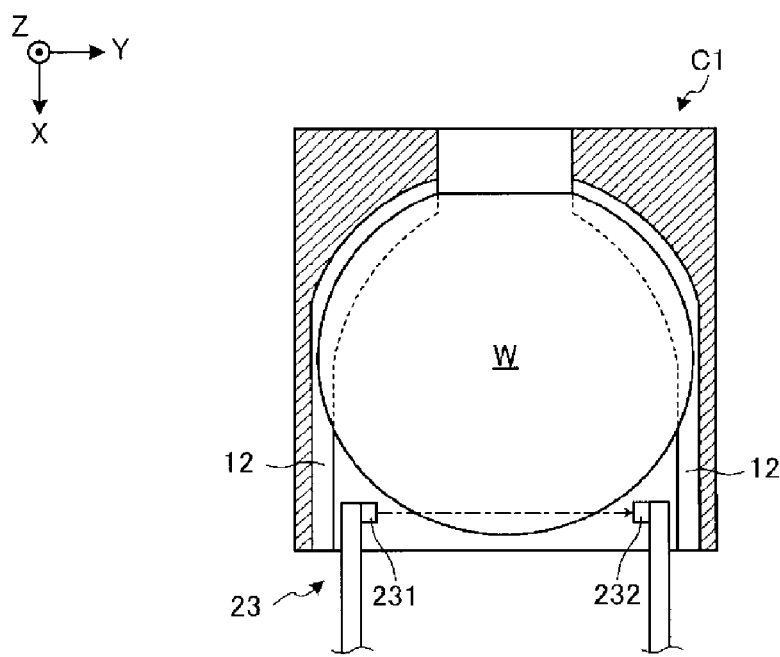
FIG. 2B illustrates a schematic configuration of the cassette and the substrate detection unit.

Hereinafter, a schematic configuration of the cassettes C1 to C4 and the substrate detection units 23 will be explained with reference to FIG. 2A and FIG. 2B. FIG. 2A and FIG. 2B illustrate a schematic configuration of the cassettes C1 to C4 and the substrate detection units 23. FIG. 2A illustrates, for example, the substrate detection unit 23 corresponding to the cassette C1.

As depicted in FIG. 2A, the cassette C1 has a box body including an opening at a side (positive direction side of the X-axis) facing the transfer station 2. A width of the cassette C1 is slightly greater than a size of the wafer W. Further, a depth of the cassette C1 is greater than the size of the wafer W and is sufficient for the wafer W not to be protruded from the opening.

Within the cassette C1, a supporting member (not illustrated) configured to support a peripheral portion of the wafer W is provided opposite to the opening and a pair of supporting members 12 and 12 configured to support right and left peripheral portions of the wafer W are provided. Since the wafer W is supported by the supporting members, the wafer W can be horizontally accommodated in the cassette C1.

The cassettes C2 to C4 also have the same configuration as the cassette C1. Herein, there has been illustrated the cassette configured to accommodate twelve sheets of the wafers W. However, the sheet number of wafers W to be accommodated in each of the cassettes C1 to C4 is not limited to twelve.

The substrate detection unit 23 includes, as depicted in FIG. 2A and FIG. 2B, a light transmitter 231 configured to irradiate light, a light receiver 232 configured to receive the light irradiated from the light transmitter 231, and a non-illustrated moving unit configured to move the light transmitter 231 and the light receiver 232 along a vertical direction. The light transmitter 231 and the light receiver 232 are horizontally arranged to face each other on both right and left sides of the opening of the cassette C1.

In the substrate detection unit 23, while light is irradiated from the light transmitter 231, the light transmitter 231 and the light receiver 232 are moved along the vertical direction by using the non-illustrated moving unit. If there is no wafer W between the light transmitter 231 and the light receiver 232, the light irradiated from the light transmitter 231 is received by the light receiver 232. Meanwhile, if there is a wafer W between the light transmitter 231 and the light receiver 232, the light irradiated from the light transmitter 231 is blocked by the wafer W and does not reach the light receiver 232. Thus, the substrate detection unit 23 can detect the wafer W accommodated in the cassette C1.

A control device 6 to be described below is configured to determine an actual accommodation position for the wafer W based on a detection signal S outputted from the substrate detection unit 23. Details thereof will be explained later.

Further, herein, there has been explained an example where the substrate detection unit 23 includes a transmission type optical sensor. However, the substrate detection unit 23 may include a reflective type optical sensor without being limited thereto.

Figure 3A:
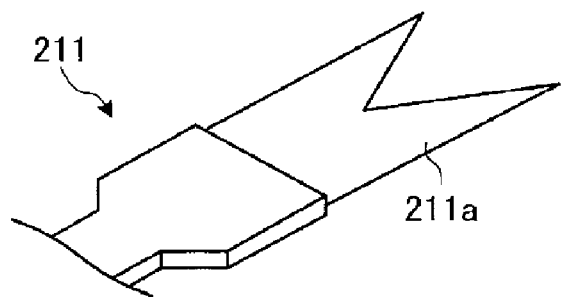
FIG. 3A is a schematic perspective view of a first holder included in a substrate transfer device.
Figure 3B:
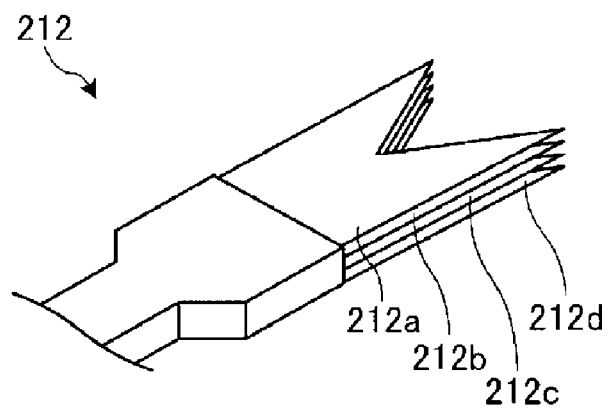
FIG. 3B is a schematic perspective view of a second holder included in the substrate transfer device.

The substrate transfer unit 21 provided in the transfer station 2 includes two substrate holders that can be operated independently from each other. Hereinafter, a configuration of each of the substrate holders included in the substrate transfer unit 21 will be explained with reference to FIG. 3A and FIG. 3B. FIG. 3A is a schematic perspective view of a first holder included in the substrate transfer unit 21, and FIG. 3B is a schematic perspective view of a second holder included in the substrate transfer unit 21.

As depicted in FIG. 3A, a first holder 211 in the substrate transfer unit 21 includes a fork 211a and holds a wafer W to be in a horizontal posture by using the fork 211a. Meanwhile, as depicted in FIG. 3B, a second holder 212 in the substrate transfer unit 21 includes multiple (herein, four) forks 212a to 212d and holds multiple (herein, four) wafers W to be in a horizontal posture at multiple levels in the vertical direction by using the multiple forks 212a to 212d. The second holder 212 is positioned above the first holder 211.

The first holder 211 and the second holder 212 are respectively provided at, for example, front ends of different arms and can be operated independently from each other. Each of gaps between the forks 211a and 212a to 212d in the vertical direction is substantially the same as a gap between the pair of the supporting members 12 and 12 (see FIG. 2A) of the cassettes C1 to C4 in the vertical direction. The substrate transfer unit 21 can simultaneously deliver multiple (herein, up to five) wafers W between the cassettes C1 to C4 and the buffer cassette by using the first holder 211 and the second holder 212.

Further, as depicted in FIG. 1, the transfer station 2 further includes a dummy wafer storage unit 24. In the dummy wafer storage unit 24, a dummy wafer Wd is stored. The dummy wafer Wd is not a product wafer unlike the wafer W. Details of a substrate accommodation method using the dummy wafer Wd will be explained in a third example embodiment. Further, in the first example embodiment, the dummy wafer storage unit 24 does not necessarily need to be provided.

The processing station 3 is positioned on a back side of the transfer station 2. The processing station includes a substrate transfer unit 31 at a central region thereof and multiple (herein, six) substrate processing units 5 arranged in a forward/backward direction on both right and left sides of the substrate transfer unit 31. In the processing station 3, the substrate transfer unit 31 transfers each wafer W between the substrate transit table 22 of the transfer station 2 and each of the substrate processing units 5, and each of the substrate processing units 5 performs a substrate process, such as a cleaning process, on each wafer W.

In the substrate processing apparatus 100 configured as described above, the substrate transfer unit 21 of the transfer station 2 unloads wafers W from the cassettes C1 to C4 mounted on the loading/unloading station 1, and then, accommodates them in the non-illustrated buffer cassette on the substrate transit table 22. Each of the wafers W accommodated in the buffer cassette is unloaded by the substrate transfer unit 31 of the processing station 3, and then, loaded into any one of the substrate processing units 5.

After performing a substrate process on each of the wafers W loaded into the substrate processing unit 5 by the substrate processing unit 5, each of the wafers W is unloaded from the substrate processing unit 5 by the substrate transfer unit 31, and then, accommodated again in the buffer cassette on the substrate transit table 22. Thereafter, the processed wafers W accommodated in the buffer cassette are returned back to the cassettes C1 to C4 by the substrate transfer unit 21.

Further, the substrate processing apparatus 100 includes the control device 6. The control device 6 is configured to control the above-described operations of the substrate processing apparatus 100.

Figure 4:
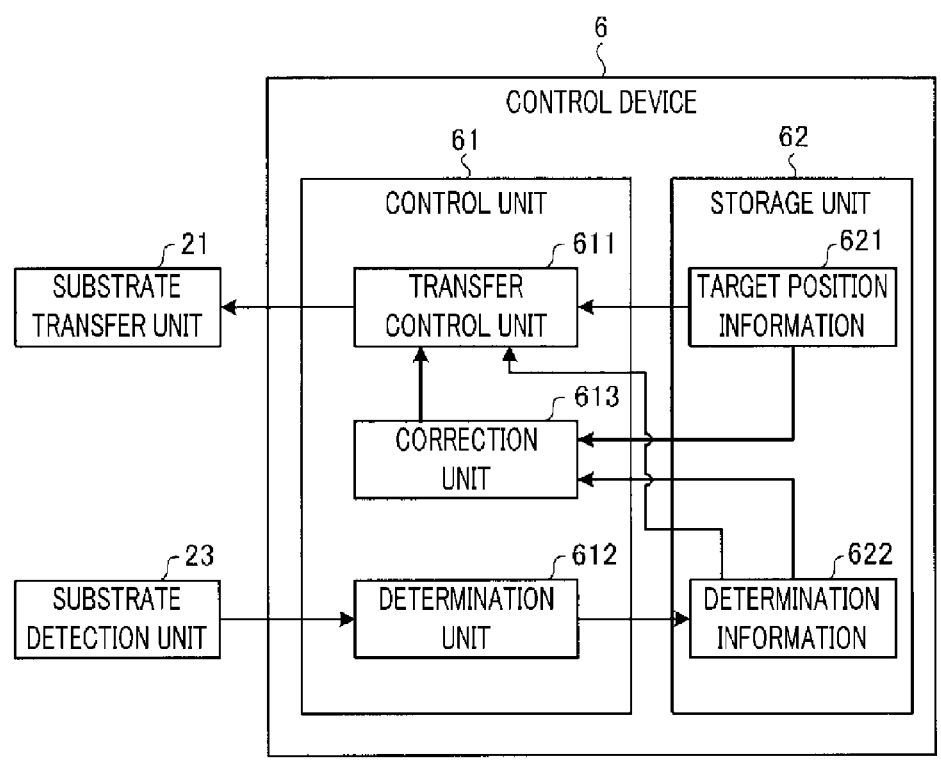
FIG. 4 is a block diagram illustrating a configuration of a control device.

Hereinafter, a configuration of the control device 6 will be explained with reference to FIG. 4. FIG. 4 is a block diagram illustrating a configuration of the control device 6. In FIG. 4, only components required to explain features of the control device 6 are illustrated, and illustration of other general components is omitted.

As depicted in FIG. 4, the control device 6 includes a control unit 61 and a storage unit 62. The control unit 61 controls the substrate transfer unit 21 to perform a process of unloading wafers W from the cassettes C1 to C4 and accommodating them in the buffer cassette and to perform a process of unloading the wafers W from the buffer cassette and accommodating them in the cassettes C1 to C4 based on information stored in the storage unit 62.

Further, a substrate transfer device described herein includes the control device depicted in FIG. 4, the substrate transfer unit 21, and the substrate detection unit 23.

Hereinafter, details of the operations of the substrate processing apparatus 100 will be explained. In the substrate processing apparatus 100, the substrate transfer unit 21 firstly performs a process of unloading wafers W from the cassettes C1 to C4 and accommodating them in the buffer cassette on the substrate transit table 22 under the control of the control device 6.

To be specific, the substrate detection units 23 detect respective positions of the wafers W accommodated in the cassettes C1 to C4. Then, the control unit 61 is configured to determine target unloading positions based on the positions detected by the substrate detection units 23 and to move the first holder 211 or the second holder 212 of the substrate transfer unit 21 to the determined target unloading positions to unload the wafers W from the cassettes C1 to C4.

Further, as the method of unloading the wafers W from the cassettes C1 to C4, for example, a substrate unloading method described in Japanese Patent Laid-open Publication No. 2003-168715 may be employed.

Then, the substrate transfer unit 31 unloads the wafer W accommodated in the buffer cassette from the buffer cassette and loads the wafer W into the substrate processing unit 5. Further, after performing a process on the wafer W by the substrate processing unit 5, the substrate transfer unit 31 unloads the processed wafer W from the substrate processing unit 5 and then accommodates the processed wafer W in the buffer cassette.

Further, the substrate transfer unit 21 unloads the processed wafer W from the buffer cassette and then returns the processed wafer W back to the cassettes C1 to C4.

Herein, when the processed wafer W is returned back to the original cassettes C1 to C4, the control unit 61 controls the processed wafer W to be accommodated at the original position in the cassettes C1 to C4 by using a detection result (target unloading positions) detected by the substrate detection unit 23 when the wafer W is unloaded from the cassettes C1 to C4.

Meanwhile, when the processed wafer W is returned back to the different cassettes C1 to C4, a process different from the above-described process is performed. Herein, as one of examples where the processed wafer W is returned back to the different cassettes C1 to C4, an example where a wafer W unloaded from the cassette C1 is returned back to the cassette C3 will be explained in detail. Herein, the cassette C3 to accommodate the processed wafer W is set to be empty.

As depicted in FIG. 4, the control unit 61 of the control device 6 includes a transfer control unit 611, a determination unit 612, and a correction unit 613. Further, the storage unit 62 of the control unit 6 stores therein target position information 621 and determination information 622.

The transfer control unit 611 controls the substrate transfer unit 21 to deliver wafers W between the cassettes C1 to C4 and the buffer cassette on the substrate transit table 22. If the empty cassette C3 accommodates an initial wafer W (hereinafter, referred to as "first wafer"), by using the target position information 621 stored6 in the storage unit 62, the transfer control unit 611 controls the substrate transfer unit 21 to accommodate the first wafer at a target accommodation position preset as an accommodation position for the first wafer.

The target position information 621 stored in the storage unit 62 is information on target accommodation positions of wafers W at respective slots in the cassettes C1 to C4. Further, the target accommodation position is a preset accommodation position for the wafer W.

The operation of unloading the wafer W from the cassettes C1 to C4 is carried out by the substrate transfer unit 21 under the control of the transfer control unit 611.

Figure 5A:
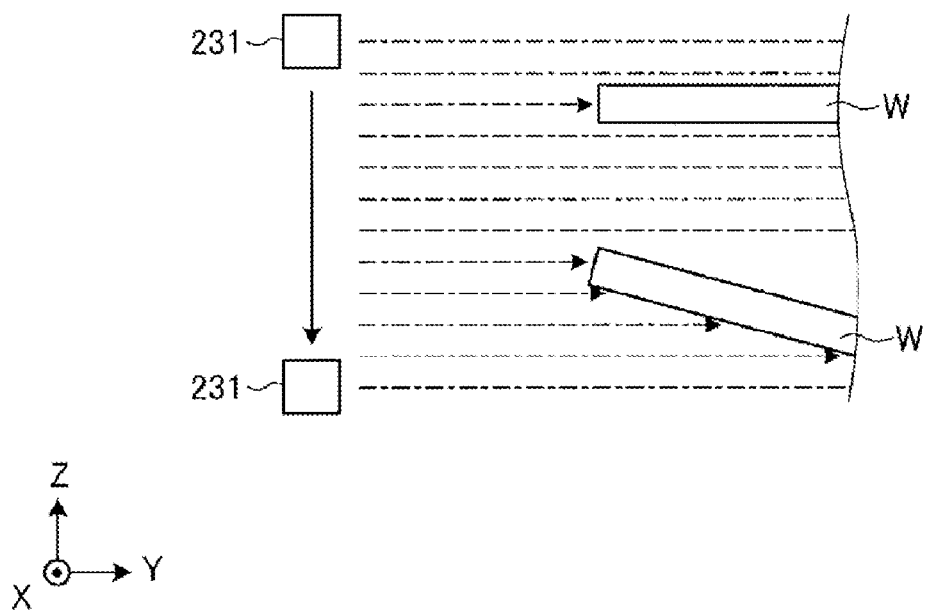
FIG. 5A is an explanatory diagram of a determination process performed by a determination unit.
Figure 5B:
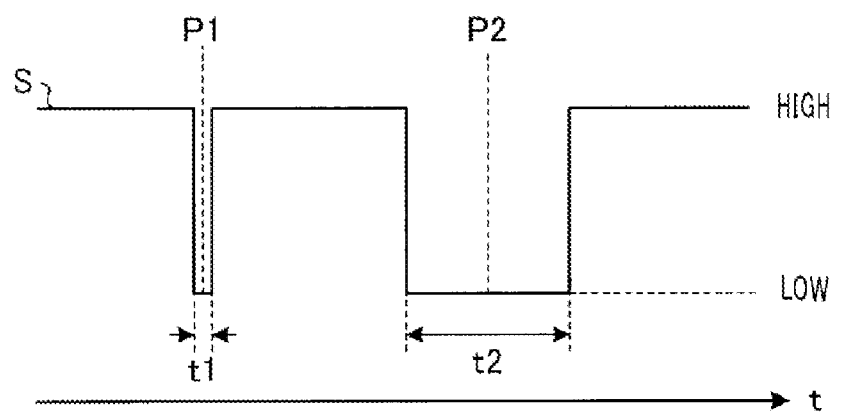
FIG. 5B is an explanatory diagram of the determination process performed by the determination unit.

The determination unit 612 determines an actual accommodation position for the wafer W accommodated in the cassette C3 based on the detection result of the substrate detection unit 23. Hereinafter, the determination process performed by the determination unit 612 will be explained with reference to FIG. 5A and FIG. 5B. FIG. 5A and FIG. 5B are explanatory diagrams of the determination process performed by the determination unit 612.

As depicted in FIG. 5A and FIG. 5B, the determination unit 612 determines a thickness of the wafer W in the vertical direction based on a time required for continuously detecting the wafer W by the substrate detection unit 23 (see t1 and t2 in FIG. 5B) and a velocity of movement of the substrate detection unit 23 in the vertical direction. Then, the determination unit 612 determines a central position (see P1 and P2 in FIG. 5B) in the thickness as the actual accommodation position for the wafer W. Further, the determination unit 612 can determine whether or not the wafer W is in a correct posture based on the thickness of the detected wafer W.

Furthermore, the determination unit 612 stores the determination information 622 including the determined actual accommodation position for the wafer W and the thickness information of the wafer W in the storage unit 62. A position determined as the actual accommodation position for the wafer W is not limited to the central position in the thickness.

The correction unit 613 calculates a deviation amount in the vertical direction between the actual accommodation position for the first wafer determined by the determination unit 612 and a target accommodation position for the wafer at each slot in the cassette C3 provided as the target position information 621. Then, the correction unit 613 calculates, as a corrected target accommodation position, a position moved in the vertical direction by the deviation amount from the preset target accommodation position as the accommodation position for a subsequent wafer W (hereinafter, referred to as "second wafer") to be accommodated in the cassette C, and then, outputs the corrected target accommodation position to the transfer control unit 611.

Then, the transfer control unit 611 controls the substrate transfer unit 21 to accommodate the second wafer at the corrected target accommodation position. Thus, even if positions of the respective slots in the cassette C3 are deviated in the vertical direction on the whole, the second wafer can be appropriately accommodated in the cassette C3 without interfering in the first wafer.

Further, the first wafer is accommodated in the cassette C3 based on the previously stored target position information 621. Since the cassette C3 is empty, however, there is no possibility that the first wafer interferes in the other wafers W.

Figure 6:
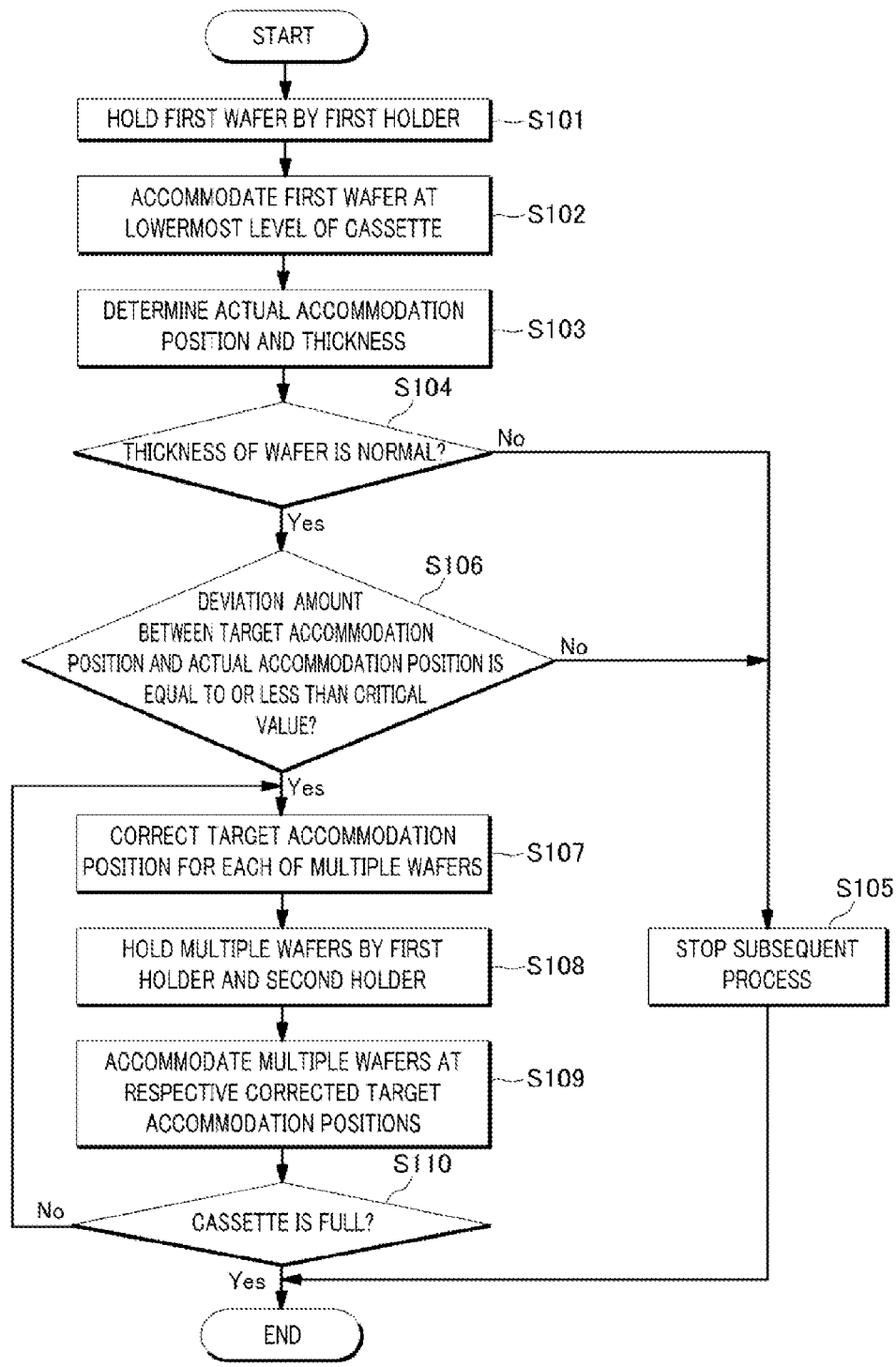
FIG. 6 is a flow chart illustrating a sequence of substrate accommodation processes performed by the substrate processing apparatus.

Hereinafter, a sequence of substrate accommodation processes in the case where a wafer, which is unloaded from the cassette C1, processed in the substrate processing unit 5, and then accommodated in the buffer cassette, is returned back to the cassette C3 will be explained in detail with reference to FIG. 6. FIG. 6 is a flow chart illustrating a sequence of substrate accommodation processes performed by the substrate processing apparatus 100. Further, FIG. 6 shows a sequence of processes from when the cassette C3 is empty to when the cassette C3 is full.

As shown in FIG. 6, in the substrate processing apparatus 100, at block S101 (Hold First Wafer by First Holder), the transfer control unit 611 of the control unit 61 controls the substrate transfer unit 21 to hold the first wafer accommodated in the non-illustrated buffer cassette on the substrate transit table 22 by using the first holder 211. Then, at block S102 (Accommodate First Wafer at Lowermost Level of Cassette), the transfer control unit 611 controls the first wafer held by the first holder 211 to be accommodated at a slot at a lowermost level in the cassette C3.

As such, since the first wafer is accommodated at the lowermost level in the cassette C3, the first wafer can be accommodated in the cassette C3 more safely.

That is, if the cassette C3 is inclined, errors between a target accommodation position and an actual accommodation potion are greater on an upper level side of the cassette. Therefore, by setting the lowermost level with a minimum error between a target accommodation position and an actual accommodation potion as an accommodation position for the first wafer to be accommodated according to the previously stored target position information 621, it is possible to reduce the possibility of contacts between the first wafer and the supporting members 12 in the cassette C3.

Further, the accommodation position for the first wafer is not limited to the lowermost level of the cassette C3, and may be an uppermost level of the cassette C3 or any one of the other levels.

Then, the substrate detection unit 23 detects the first wafer accommodated in the cassette C3. Thereafter, in the substrate processing apparatus 100, at block S103 (Determine Actual Accommodation Position and Thickness), the determination unit 612 of the control device 6 determines an actual accommodation position for the first wafer accommodated in the cassette C3 and a thickness of the first wafer based on the detection results of the substrate detection unit 23. Then, the determination unit 612 stores the determination information 622 including the actual accommodation position for the first wafer and the thickness of the first wafer in the storage unit 62.

Then, at block S104 (Determine whether Thickness of Wafer Is Normal), the transfer control unit 611 determines whether the thickness of the first wafer is normal or not. To be specific, the transfer control unit 611 determines that the thickness of the first wafer is normal when the thickness of the first wafer provided as the determination information 622 is equal to or smaller than a critical value, or determines that the thickness of the first wafer is abnormal when the thickness of the first wafer is greater than the critical value.

That is, if the thickness of the first wafer determined by the determination unit 612 is great, or in other words, if a time required for detecting the first wafer by the substrate detection unit 23 is long, the first wafer may be accommodated as being inclined. Therefore, in this case, the transfer control unit 611 determines that the thickness of the first wafer is abnormal (block S104, No), and, at block S105 (Stop Subsequent Process), a subsequent process is stopped and the substrate accommodation process is finished.

As such, the transfer control unit 611 determines whether or not the thickness of the first wafer accommodated in the cassette C3 is normal based on the time required for detecting the first wafer by the substrate detection unit 23, and if it is determined that the thickness is abnormal, the transfer control unit 611 stops a subsequent process. Thus, it is possible to avoid the possibility that a subsequent wafer W including the second wafer is damaged by being contacted with the first wafer accommodated in an abnormal posture in the cassette C3.

Herein, whether or not the thickness of the first wafer is normal is determined by whether the thickness of the first wafer is equal to or smaller than the critical value. However, whether or not the thickness of the first wafer is normal may be determined by whether the time required for detecting the first wafer by the substrate detection unit 23 is equal to or less than a critical value.

Meanwhile, if it is determined that the thickness of the first wafer is normal (block S104, Yes), the correction unit 613 calculates a deviation amount between the target accommodation position for the first wafer provided as the target position information 621 and the actual accommodation position for the first wafer provided as the determination information 622. Then, at block S106 (Determine whether Deviation Amount between Target Accommodation Position and Actual Accommodation position Is Equal to or Less than Critical Value), the transfer control unit 611 determines whether or not the calculated deviation amount is equal to or less than a critical value.

If the deviation amount is more than the critical value (block S106, No), the transfer control unit 611 stops a subsequent process at block S105 and finishes the substrate accommodation process.

As such, if the deviation amount between the actual accommodation position and the target accommodation position for the first wafer is greater than the critical value, the transfer control unit 611 determines that there is an abnormality in the cassette C3 to stop a subsequent process. Thus, it is possible to avoid the possibility that the subsequent wafer W including the second wafer is damaged by accommodating the subsequent wafer W in the cassette C3 having the abnormality.

Meanwhile, if it is determined that deviation amount between the actual accommodation position and the target accommodation position for the first wafer is equal to or less than the critical value (block S106, Yes), at block S107 (Correct Target Accommodation Position for Each of Multiple Wafers), the correction unit 613 corrects a target accommodation position for each of multiple (for example, five) wafers W by the deviation amount calculated at block S106.

Then, at block S108 (Hold Multiple Wafers by First Holder and Second Holder), the transfer control unit 611 controls the substrate transfer unit 21 to hold the multiple wafers W (second wafers) accommodated in the non-illustrated buffer cassette on the substrate transit table 22 by using the first holder 211 and the second holder 212. Further, at block S109 (Accommodate Multiple Wafers at Respective Corrected Target Accommodation Positions), the transfer control unit 611 controls the multiple wafers W held by the first holder 211 and the second holder 212 to be simultaneously accommodated at the target accommodation positions of the respective wafers W corrected at block S107.

As such, the control unit 61 controls the multiple second wafers to be simultaneously accommodated at the corrected target accommodation positions after the first wafer is accommodated in the cassette C3. Thus, it is possible to reduce a time required for the substrate accommodation processes.

Herein, the multiple second wafers are simultaneously accommodated in the cassette C3 while being held by the first holder 211 and the second holder 212. However, the transfer control unit 611 may use, at least, the second holder 212 to accommodate the multiple second wafers in the cassette C3, but does not necessarily need to use the first holder 211.

Then, at block S110 (Determine whether Cassette Is Full), the control unit 61 determines whether or not the cassette C3 is full. Whether or not the cassette is full may be determined based on control information of the substrate transfer unit 21 provided by the transfer control unit 611. If the cassette C3 is not full (block S110, No), the control unit 61 repeats the processes from block S107 to block S110 until the cassette C3 is full (that is, the same operation is continuously performed on subsequent wafers W including a third wafer). If it is determined that the cassette C3 is full (block S110, Yes), the control unit 61 finishes the substrate accommodation processes.

As described above, the substrate processing apparatus 100 in accordance with the first example embodiment includes the substrate transfer unit 21, the substrate detection unit 23, and the control device 6. The substrate transfer unit 21 delivers substrates with respect to the cassettes C1 to C4 capable of accommodating multiple wafers W. The substrate detection unit 23 detects the substrates accommodated in the cassettes C1 to C4. The control device 6 controls the substrate transfer unit 21.

Further, the control device 6 includes the transfer control unit 611, the determination unit 612, and the correction unit 613. The transfer control unit 611 controls the substrate transfer unit 21 to accommodate the first wafer at a preset target accommodation position. After the first wafer accommodated in the cassette C3 is detected by the substrate detection unit 23, the determination unit 612 determines an actual accommodation position for the first wafer based on the detection result of the substrate detection unit 23. Further, the correction unit 613 corrects preset target accommodation positions for the second wafer and subsequent wafers based on a deviation amount between the actual accommodation position and the target accommodation position for the first wafer.

Therefore, in the substrate processing apparatus 100 in accordance with the first example embodiment, the wafers W can be appropriately accommodated in the cassette C3.

Second Example Embodiment

However, in the first example embodiment described above, there has been explained the case where the deviation amount between the actual accommodation position and the target accommodation position for the first wafer is used as a correction amount, and this correction amount is applied to target accommodation positions for all the subsequent wafers W. That is, in the first example embodiment described above, a deviation amount between an actual accommodation position and a target accommodation position for a wafer W is calculated only from the first wafer as the first sheet of wafers W.

Figure 7:
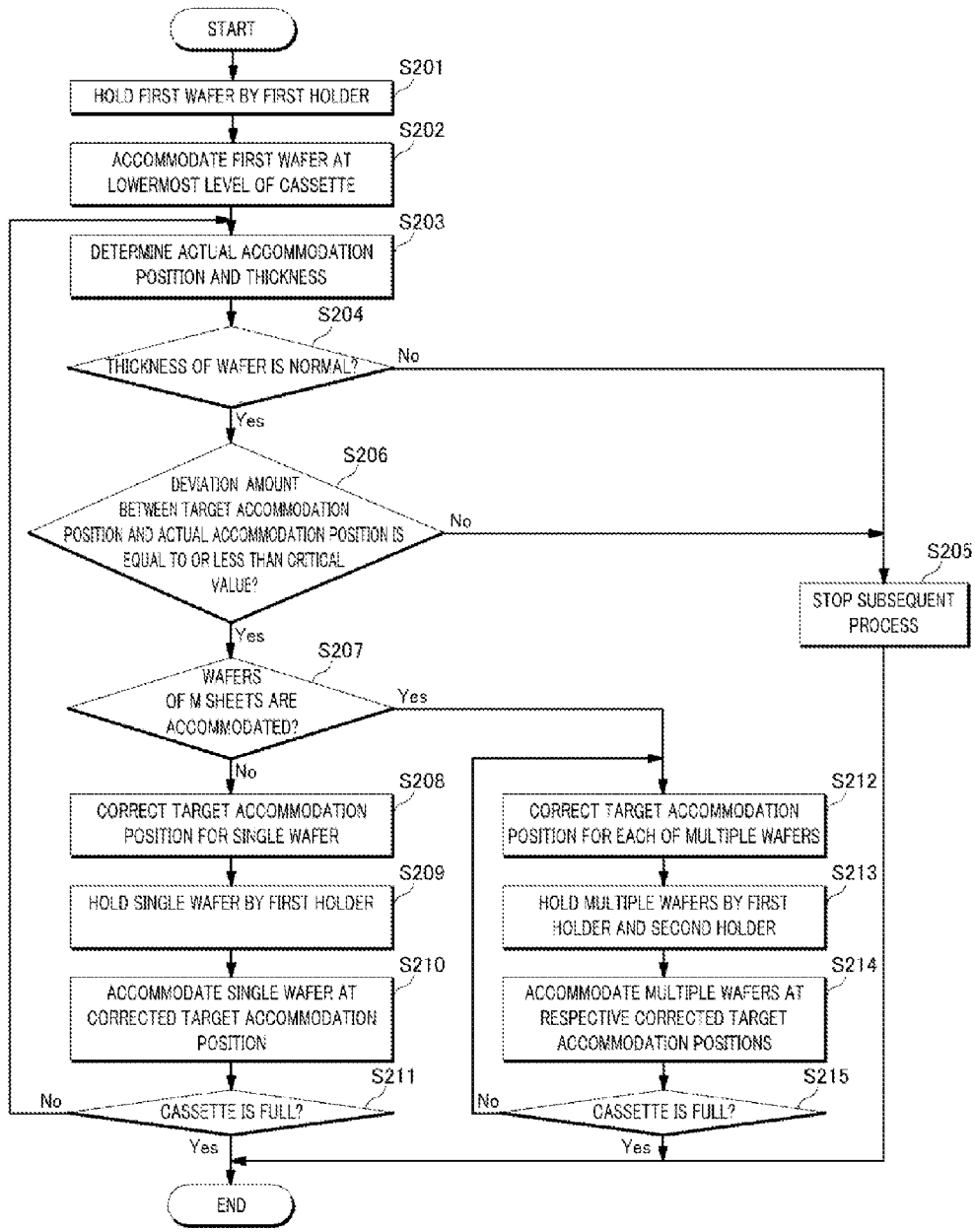
FIG. 7 is a flow chart illustrating a sequence of substrate accommodation processes in accordance with a second example embodiment.

However, the substrate accommodation processes are not limited thereto. Whenever a wafer W is accommodated in the cassette C3, the deviation amount may be calculated. Hereinafter, the substrate accommodation processes in this case will be explained with reference to FIG. 7. FIG. 7 is a flow chart illustrating a sequence of substrate accommodation processes in accordance with a second example embodiment. The processes from block S201 to S206 in FIG. 7 are the same as the processes from S101 to S106 in FIG. 6, and, thus, explanations thereof will be omitted.

As shown in FIG. 7, if it is determined that the thickness of the first wafer is normal at block S206 (block S206, Yes), at block S207 (Determine whether Wafers of M sheets Are Accommodated), the control unit 61 determines whether or not it is completed to accommodate a preset number (herein, m) of wafers W into the cassette C3.

In this process, if the number of wafers W accommodated in the cassette C3 does not reach m (block S207, No), at block S208 (Correct Target Accommodation Position for Single Wafer), the correction unit 613 corrects a target accommodation position for a single wafer W to be subsequently accommodated in the cassette C3 based on the actual accommodation position for the wafer W accommodated in the cassette C3 this time. Then, at block S209 (Hold Single Wafer by First Holder), the transfer control unit 611 controls the substrate transfer unit 21 to hold the single wafer W accommodated in the buffer cassette by using the first holder 211 and, at block S210 (Accommodate Single Wafer at Corrected Target Accommodation Position), the wafer W is accommodated at the corrected target accommodation position.

Then, at block S211 (Determine whether Cassette Is Full), the control unit 61 determines whether or not the cassette C3 is full. If the cassette C3 is not full (block S211, No), the control unit 61 repeats the processes from block S203 to block S211 until the number of wafers W accommodated in the cassette C3 reaches m.

As such, in the second example embodiment, whenever a wafer W is accommodated in the cassette C3, an actual accommodation position is calculated, so that a target accommodation position for a subsequent wafer W is corrected. To be specific, whenever a wafer W is accommodated in the cassette C3, the determination unit 612 determines an actual accommodation position for the wafer W. Further, whenever a wafer W is accommodated in the cassette C3, the correction unit 613 corrects a target accommodation position for a subsequent wafer based on the actual accommodation position for the wafer W. Thus, a wafer can be appropriately accommodated in the cassette C.

Meanwhile, if it is determined that it is completed to accommodate a m-th wafer at block S207 (block S207, Yes), at block S212 (Correct Target Accommodation position for Each of Multiple Wafers), the correction unit 613 corrects a target accommodation position for each of multiple (for example, five) wafers W based on the actual accommodation position for the m-th wafer W.

Then, at block S213 (Hold Multiple Wafers By First Holder and Second Holder), the transfer control unit 611 controls the substrate transfer unit 21 to hold multiple wafers W accommodated in the buffer cassette by using the first holder 211 and the second holder 212 and, at block S214 (Accommodate Multiple Wafers at Respective Corrected Target Accommodation Positions), the wafers W are simultaneously accommodated at the respective corrected target accommodation positions.

Thereafter, at block S215 (Determine whether Cassette Is Full), the control unit 61 determines whether or not the cassette C3 is full. If the cassette C3 is not full (block S215, No), the control unit 61 repeats the processes from block S212 to block S215 until the cassette C3 is full.

Then, if it is determined that the cassette C3 is full at block S211 (block S211, Yes), if it is determined that the cassette C3 is full at block S215 (block S215, Yes), or if the process is stopped at block S205, the substrate accommodation processes are finished.

As such, in the second example embodiment, if the number of wafers W accommodated in the cassette C3 reaches a preset number, i.e. if the preset number of wafers W are accommodated in a normal state without stopping the process, it is determined that an abnormality is less likely to occur in the next and the multiple wafers W are gathered and accommodated in the cassette C3. Thus, the wafers W can be appropriately accommodated in the cassette C3 in a short time.

Third Example Embodiment

However, in the first example embodiment and the second example embodiment described above, there has been explained the case where the first wafer W firstly accommodated in the cassettes C1 to C4 is a wafer W as a product wafer. However, the first wafer may be the dummy wafer Wd (see FIG. 1) instead of the product wafer. Hereinafter, in a third example embodiment, there will be explained a case where the dummy wafer Wd is used as the first wafer.

In this case, in the substrate processing apparatus 100, while the wafer W is processed in the substrate processing unit 5, the substrate transfer unit 21 unloads the dummy wafer Wd from the dummy wafer storage unit 24 under the control of the transfer control unit 611.

Then, in the substrate processing apparatus 100, the same processes as those at blocks S102 and S103 shown in FIG. 6 or blocks S202 and S203 shown in FIG. 7 are performed. That is, the dummy wafer Wd unloaded from the dummy wafer storage unit 24 by the substrate transfer unit 21 is accommodated at a slot at a lowermost level in the empty cassette C3, and the substrate detection unit 23 detects the dummy wafer Wd. Then, the determination unit 612 determines an actual accommodation position for the dummy wafer Wd and a thickness of the dummy wafer Wd based on the detection result of the substrate detection unit 23.

After the actual accommodation position for the dummy wafer Wd and the thickness of the dummy wafer Wd are determined by the determination unit 612, the substrate transfer unit 21 unloads the dummy wafer Wd from the cassette C3 and returns the dummy wafer Wd to the dummy wafer storage unit 24. Thus, the cassette C3 becomes empty again.

Then, the substrate transfer unit 21 unloads a wafer W as a product wafer processed by the substrate processing unit 5 from the buffer cassette. Thereafter, the substrate transfer unit 21 accommodates the wafer W unloaded from the buffer cassette at the actual accommodation position for the dummy wafer Wd determined by the determination unit 612.

As such, in the third example embodiment, before the product wafer is accommodated in the cassette C3, the dummy wafer Wd is accommodated in the cassette C3 and an actual accommodation position for the dummy wafer Wd is determined. By using the actual accommodation position for the dummy wafer Wd, the first sheet of a product wafer is accommodated in the cassette C3. Thus, it is possible to reduce a risk of damage to the product wafer to be firstly accommodated in the cassette C3.

Further, subsequent processes are the same as those at blocks S103 to S110 shown in FIG. 6 or blocks S203 to S215 shown in FIG. 7. That is, the determination unit 612 determines an actual accommodation position and a thickness for the wafer W accommodated in the cassette C3, and determines whether or not the thickness of the wafer W is normal, and whether or not a deviation amount between the actual accommodation position and a target accommodation position is equal to or less than a critical value. Then, a target accommodation position for each of multiple wafers W is corrected, and the multiple wafers W are simultaneously accommodated at the corrected target accommodation positions.

In the example embodiment described above, after the actual accommodation position for the dummy wafer Wd is determined, the actual accommodation position for the wafer W to be accommodated at the same place as the dummy wafer Wd is also determined. However, the determination process for the wafer W to be accommodated at the same place as the dummy wafer Wd may be omitted, and the target accommodation position for each of multiple wafers W may be corrected based on the actual accommodation position for the dummy wafer Wd.

Fourth Example Embodiment

Figure 8:
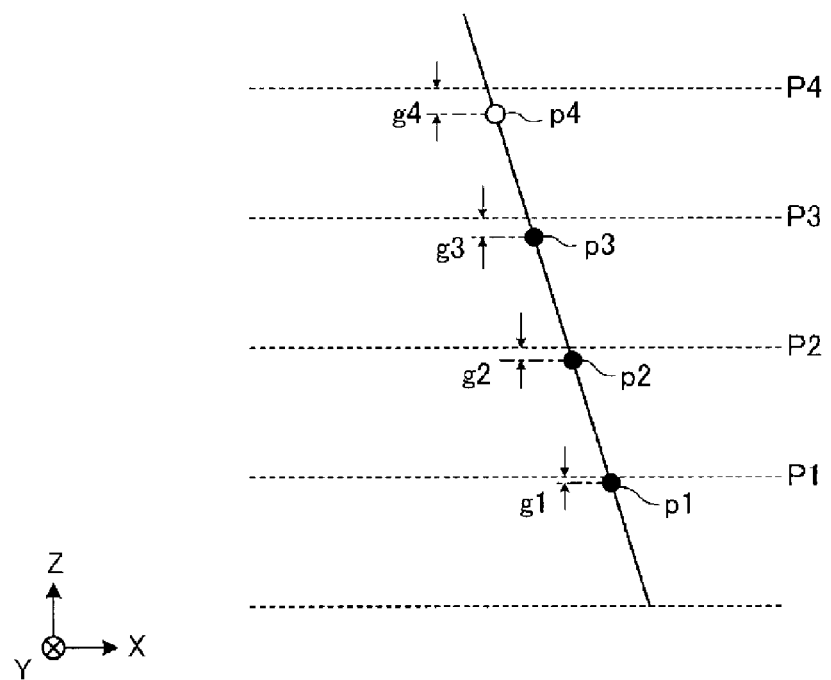
FIG. 8 is an explanatory diagram for predicting a deviation amount between a target accommodation position and an actual accommodation position for a subsequent wafer.

The substrate processing apparatus 100 may predict a deviation amount between a target accommodation position and an actual accommodation position for a subsequent wafer W by using the accumulated determination information 622. Details thereof will be explained with reference to FIG. 8. FIG. 8 is an explanatory diagram for predicting a deviation amount between a target accommodation position and an actual accommodation position for a subsequent wafer W.

In FIG. 8, P1 to P4 represent target accommodation positions, and p1 to p3 represent actual accommodation positions determined based on detection results of the substrate detection unit 23.

By way of example, if the cassette C3 is inclined, as depicted in FIG. 8, deviation amounts g1 to g3 between the target accommodation positions P1 to P3 and the actual accommodation positions p1 to p3 are greater on an upper level side of the cassette C3. The correction unit 613 accumulates the deviation amounts g1 to g3 in the storage unit 62, calculates a change rate in the deviation amount from the accumulated deviation amounts g1 to g3, and predicts a subsequent deviation amount g4 by using the calculated change rate and a subsequent target accommodation position P4. Then, the correction unit 613 calculates the corrected target accommodation position P4 by using the predicted deviation amount g4.

As such, deviation amounts between target accommodation positions and actual accommodation positions may be accumulated in the storage unit 62, and a subsequent deviation amount may be predicted based on the accumulated deviation amounts. Thus, it is possible to increase correction accuracy of a target accommodation position.

Further, the control unit 61 may modify the number of wafers W to be simultaneously accommodated based on the accumulated information of the deviation amounts between the target accommodation positions and the actual accommodation positions.

That is, as an inclination of the cassette C3 is increased, it becomes more difficult to simultaneously accommodate multiple wafers W in the cassette C3. Therefore, as the change rate in the deviation amounts is increased, the transfer control unit 611 may reduce the number of wafers W to be simultaneously accommodated.

By way of example, the transfer control unit 611 may predict actual accommodation positions of multiple wafers W to be subsequently accommodated by using the change rate in the deviation amounts, and may calculate a maximum number of wafers W to be simultaneously accommodated at the predicted actual accommodation positions. Then, the transfer control unit 611 may control the substrate transfer unit 21 to simultaneously accommodate the maximum number of wafers W in the cassette C3.

In the example embodiments described above, there has been explained the case where the substrate detection unit 23 is an exclusive unit provided in the transfer station 2. However, the substrate detection unit 23 may be a unit in which, for example, a light transmitter and a light receiver are respectively provided at front ends of the fork 211*a* of the first holder 211.

Further, in the example embodiments described above, there has been explained the case where the first wafer is a wafer W to be firstly accommodated in the cassette C3. However, the first wafer is not limited thereto and may be a wafer W subsequent to a second wafer.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

We claim:
1. A substrate transfer device comprising:
a substrate transfer unit configured to deliver a substrate with respect to a cassette configured to accommodate the substrate;
a detection unit configured to detect the substrate accommodated in the cassette; and
a control device configured to control the substrate transfer unit,
wherein the control device includes:
a transfer control unit configured to control the substrate transfer unit to accommodate the substrate at a predetermined target accommodation position;
a determination unit configured to determine an actual accommodation position for the substrate based on a detection result of the detection unit after the detection unit detects the substrate accommodated in the cassette; and
a correction unit configured to correct a predetermined target accommodation position as an accommodation position for another substrate based on a difference between the actual accommodation position and the target accommodation position for the substrate.

2. The substrate transfer device of claim 1,
wherein the transfer control unit is configured to control the substrate transfer unit to accommodate a single substrate at a predetermined target accommodation position, and
the correction unit is configured to correct a predetermined target accommodation position as an accommodation position for each of multiple substrates to be subsequently accommodated based on a difference between the actual accommodation position and the target accommodation position for the single substrate.

3. The substrate transfer device of claim 2,
wherein the substrate transfer unit includes a first holder configured to hold the single substrate; and a second holder configured to hold the multiple substrates, and
the transfer control unit is configured to control at least the second holder to hold the multiple substrates after the first holder is controlled to hold the single substrate and accommodate the single substrate in the cassette, and configured to control the multiple substrates to be simultaneously accommodated at the corrected target accommodation positions for the multiple substrates by the correction unit.

4. The substrate transfer device of claim 1,
wherein the determination unit is configured to determine the actual accommodation position for the substrate whenever the substrate is accommodated in the cassette, and
the correction unit is configured to correct a target accommodation position for a subsequent substrate based on a difference between the actual accommodation position for the substrate and the corrected target accommodation position for the substrate whenever the substrate is accommodated in the cassette.

5. The substrate transfer device of claim 1,
wherein the transfer control unit is configured to control the substrate transfer unit to accommodate a substrate to be firstly accommodated in the cassette at a predetermined target accommodation position as a lowermost level of the cassette.

6. The substrate transfer device of claim 1,
wherein the transfer control unit is configured to control the substrate transfer unit to accommodate a dummy substrate at a predetermined target accommodation position, unload the dummy substrate from the cassette after the determination unit determines an actual accommodation position for the dummy substrate, and accommodate the substrate at the actual accommodation position for the dummy substrate.

7. A substrate processing apparatus comprising:
a substrate transfer device configured to load a substrate from an outside;
a substrate processing unit configured to process the substrate loaded by the substrate transfer device; and a transit unit configured to deliver the substrate loaded by the substrate transfer device to the substrate processing unit, wherein the substrate transfer device includes:

a substrate transfer unit configured to deliver the substrate with respect to a cassette configured to accommodate the substrate;

a detection unit configured to detect the substrate accommodated in the cassette; and a control device configured to control the substrate transfer unit, wherein the control device includes:

a transfer control unit configured to control the substrate transfer unit to accommodate the substrate at a predetermined target accommodation position;

a determination unit configured to determine an actual accommodation position for the substrate based on a detection result of the detection unit after the detection unit detects the substrate accommodated in the cassette; and a correction unit configured to correct a predetermined target accommodation position as an accommodation position for another substrate based on a difference between the actual accommodation position and the target accommodation position for the substrate.

8. A substrate accommodation method comprising:

a first accommodation process of controlling a substrate transfer unit, which delivers a substrate with respect to a cassette configured to accommodate the substrate, to accommodate the substrate at a predetermined target accommodation position a determination process of determining an actual accommodation position for the substrate based on a detection result of a detection unit configured to detect the substrate accommodated in the cassette after the detection unit detects the substrate accommodated in the cassette;

a correction process of correcting a predetermined target accommodation position as an accommodation position for another substrate based on a difference between the actual accommodation position and the target accommodation position for the substrate; and a second accommodation process of controlling the substrate transfer unit to accommodate the another substrate at the corrected target accommodation position in the correction process.

9. The substrate accommodation method of claim 8, wherein, in the first accommodation process, the substrate transfer unit is controlled to accommodate a single substrate at a predetermined target accommodation position as an accommodation position for the single substrate, and in the correction process, a predetermined target accommodation position as an accommodation position for each of multiple substrates to be subsequently accommodated is corrected based on a difference between the actual accommodation position and the target accommodation position for the single substrate.

10. The substrate accommodation method of claim 9, wherein the substrate transfer unit includes a first holder configured to hold the single substrate; and a second holder configured to hold the multiple substrates, and in the first accommodation process, the single substrate is accommodated in the cassette while being held by the first holder, and in the second accommodation process, the multiple substrates simultaneously accommodated at the corrected target accommodation positions for the multiple substrates in the correction process while being held by at least the second holder.

11. The substrate accommodation method of claim 8, wherein, in the determination process, the actual accommodation position for the substrate is determined whenever the substrate is accommodated in the cassette, and in the correction process, a target accommodation position for a subsequent substrate is corrected based on a difference between the actual accommodation position for the substrate and the corrected target accommodation position for the substrate whenever the substrate is accommodated in the cassette.

12. The substrate accommodation method of claim 8, wherein, in the first accommodation process, the substrate transfer unit is controlled to accommodate a substrate to be firstly accommodated in the cassette at a predetermined target accommodation position as a lowermost level of the cassette.

13. The substrate accommodation method of claim 8, wherein, in the first accommodation process, the substrate transfer unit is controlled to accommodate a dummy substrate at a predetermined target accommodation position, unload the dummy substrate from the cassette after an actual accommodation position for the dummy substrate is determined in the determination process, and accommodate the substrate at the actual accommodation position for the dummy substrate.

\* \* \* \* \*